United States Patent
Ho et al.

(10) Patent No.: US 9,437,549 B2
(45) Date of Patent: Sep. 6, 2016

(54) METHOD FOR MANUFACTURING CERAMIC SUBSTRATE

(71) Applicant: VIKING TECH CORPORATION, Hsinchu County (TW)

(72) Inventors: Chien-Hung Ho, Hsinchu County (TW); Chen-Shen Kuo, Hsinchu County (TW); Chun-Chu Wu, Hsinchu County (TW)

(73) Assignee: VIKING TECH CORPORATION, Hsinchu County (TW)

( * ) Notice: Subject to any disclaimer, the term of this patent is extended or adjusted under 35 U.S.C. 154(b) by 0 days.

(21) Appl. No.: 14/808,656

(22) Filed: Jul. 24, 2015

(65) Prior Publication Data
US 2016/0049372 A1    Feb. 18, 2016

(30) Foreign Application Priority Data
Jul. 24, 2014   (TW) .............................. 103125263 A

(51) Int. Cl.
| | | |
|---|---|---|
| *H01L 23/538* | (2006.01) | |
| *H01L 23/498* | (2006.01) | |
| *H01L 31/0203* | (2014.01) | |
| *H01L 21/48* | (2006.01) | |
| *B28B 11/08* | (2006.01) | |
| *B23K 26/38* | (2014.01) | |
| *B24C 1/04* | (2006.01) | |
| *B23K 26/40* | (2014.01) | |
| *H01L 33/64* | (2010.01) | |
| *H01L 23/24* | (2006.01) | |

(52) U.S. Cl.
CPC ......... *H01L 23/5389* (2013.01); *B23K 26/364* (2015.10); *B23K 26/38* (2013.01); *B23K 26/402* (2013.01); *B24C 1/04* (2013.01); *B28B 11/0863* (2013.01); *H01L 21/4846* (2013.01); *H01L 23/49838* (2013.01); *H01L 23/49894* (2013.01); *H01L 31/0203* (2013.01); *H01L 33/64* (2013.01); *B23K 2203/52* (2015.10); *H01L 23/24* (2013.01); *H01L 2224/16225* (2013.01); *H01L 2924/181* (2013.01)

(58) Field of Classification Search
CPC ............ H01L 23/538; H01L 23/5389; H01L 23/5226; H01L 23/49838; H01L 23/49827
See application file for complete search history.

(56) References Cited

U.S. PATENT DOCUMENTS

| | | | | |
|---|---|---|---|---|
| 2004/0252166 A1* | 12/2004 | Conta | .................... | B41J 2/1603 347/63 |
| 2005/0218806 A1* | 10/2005 | Sawa | ......................... | H01J 9/02 313/582 |
| 2013/0119553 A1* | 5/2013 | Jeong | ................... | H01L 23/5389 257/774 |
| 2013/0181351 A1* | 7/2013 | Yang | ....................... | H01L 24/24 257/762 |

* cited by examiner

*Primary Examiner* — Phuc Dang
(74) *Attorney, Agent, or Firm* — Muncy, Geissler, Olds & Lowe, P.C.

(57) ABSTRACT

A method for manufacturing a ceramic substrate is characterized in using a preformed trench, a patterned protective layer and a sand blasting process to manufacture a cavity in a ceramic substrate and control the cavity size and shape of the ceramic substrate. The ceramic substrate is collocated with a base substrate to form a package substrate for packaging a semiconductor chip. The manufacturing method set forth above can lower the manufacturing cost and raise the accuracy of the size and shape of the cavity of the ceramic substrate. The abovementioned method can reduce the fabrication cost and increase the precision of the shape and size of a ceramic substrate.

6 Claims, 4 Drawing Sheets

US 9,437,549 B2

METHOD FOR MANUFACTURING CERAMIC SUBSTRATE

BACKGROUND OF THE INVENTION

1. Field of the Invention

The present invention relates to a ceramic substrate, particularly to a ceramic substrate cooperating with a base substrate to form a package substrate.

2. Description of the Prior Art

In comparison with an ordinary plastic leaded chip carrier (PLCC), a ceramic package substrate features better performance in heat resistance, yellowness resistance, heat dissipation and reliability. A ceramic package substrate is usually as the package substrate of a high power transistor chip.

A common ceramic package substrate is normally fabricated into a one-piece component with a low-temperature co-fired ceramic (LTCC) technology. While there is a slight modification in the product, such as varying the carrying area or side wall of a ceramic package substrate, the mold of the ceramic package substrate needs modifying, or even redesigning and fabricating once again. Therefore, the fabrication cost of a ceramic package substrate is very high. Further, the size or shape of the cavities in the chip receiving area of a ceramic package substrate is very likely to be affected by material shrinkage during the sintering process.

Therefore, the industry is eager to provide a ceramic substrate whose cavity is precisely controlled for a semiconductor chip package component.

SUMMARY OF THE INVENTION

The present invention provides a method for manufacturing a ceramic substrate, wherein a preformed trench, a patterned protective layer and a sand blasting process are used to precisely control the size and shape of the cavities of a ceramic substrate, and wherein the ceramic substrate and a base substrate are fabricated into a package substrate for packaging a semiconductor chip.

A further embodiment of the present invention provides a method for manufacturing a ceramic substrate having a cavity, which comprises steps: providing a ceramic substrate having a first surface and a second surface opposite the first surface; fabricating a preformed trench on the first surface of the ceramic substrate; fabricating a patterned protective layer in the second surface of the ceramic substrate; and sand-blasting the second surface of the ceramic substrate to form a cavity penetrating the first surface and the second surface, wherein the cavity has a vertical portion and a gradually-varying portion, and wherein the vertical portion is near the first surface and has an inner diameter equal to a first diameter of the cavity on the first surface, and wherein the gradually-varying portion is near the second surface and has an inner diameter gradually increasing from the first diameter to a second diameter of the cavity on the second surface.

The present invention can precisely manufacture ceramic substrates respectively having cavities with different shapes and sizes, neither modifying the mold nor redesigning/re-fabricating the mold. The present invention can further use the ceramic substrates and the base substrate of a common specification to fabricate package chips for packaging semiconductor chips. Therefore, the present invention can reduce the fabrication cost and increase the precision of the shape and size of the cavity of a ceramic substrate.

Below, embodiments are described in detail in cooperation with the attached drawings to make easily understood the objectives, technical contents, characteristics and accomplishments of the present invention.

DESCRIPTION OF THE PREFERRED EMBODIMENT

Figure 1A:
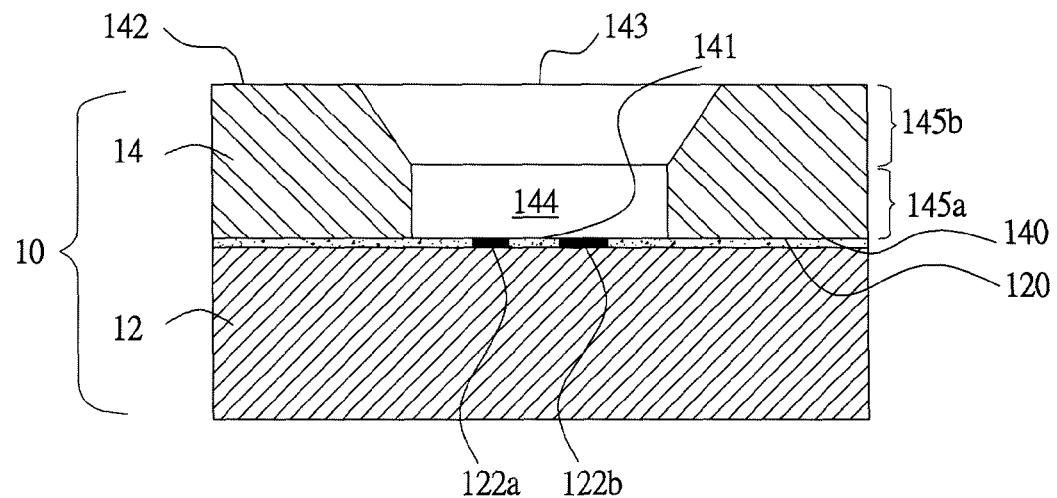
FIG. 1a is a sectional view schematically showing a package substrate according to one embodiment of the present invention.
Figure 1B:
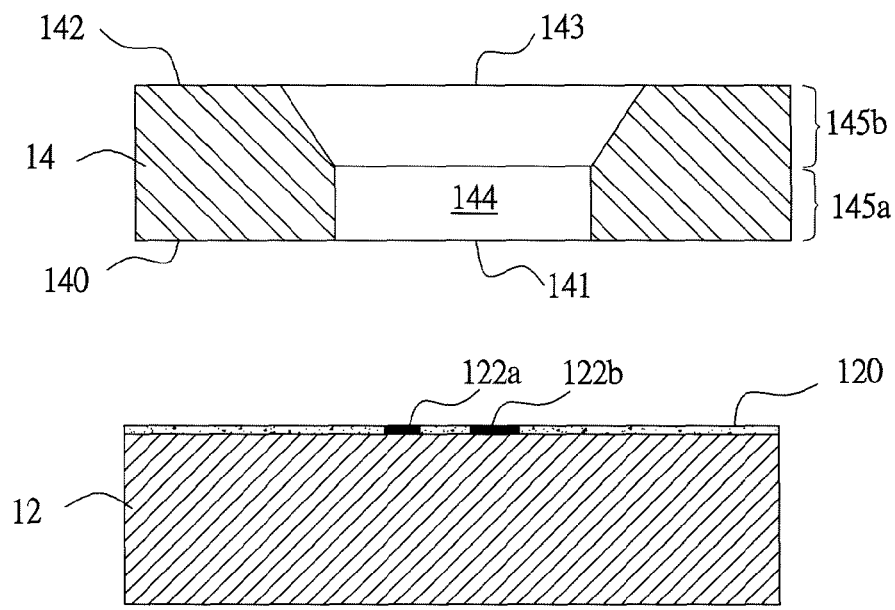
FIG. 1b is an exploded view schematically showing a package substrate according to one embodiment of the present invention.
Figure 4:
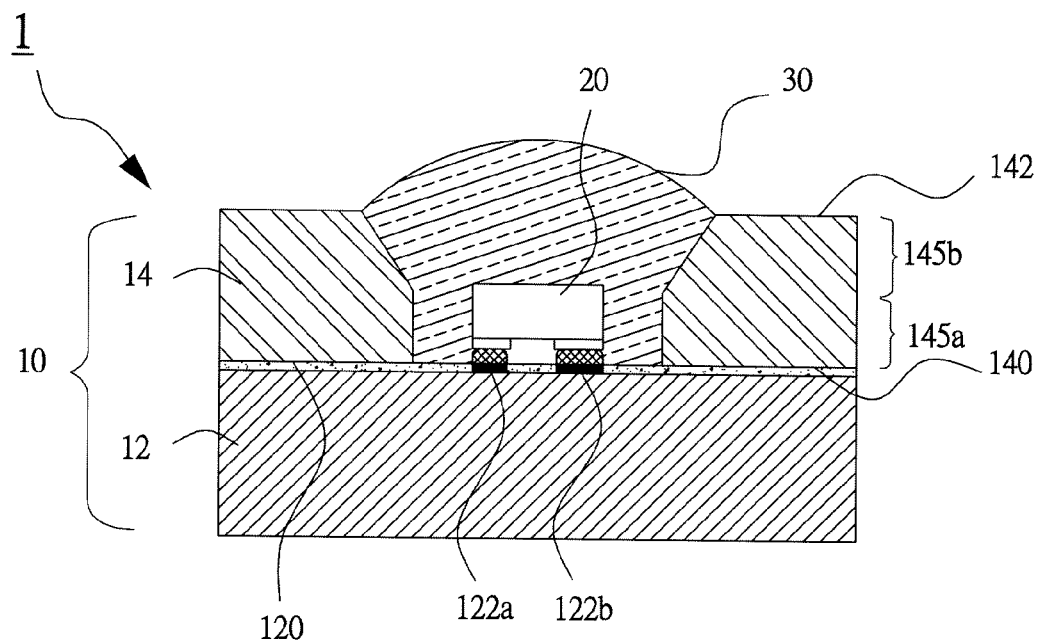
FIG. 4 is a sectional view schematically showing a semiconductor chip package component according to one embodiment of the present invention.
Figure 5:
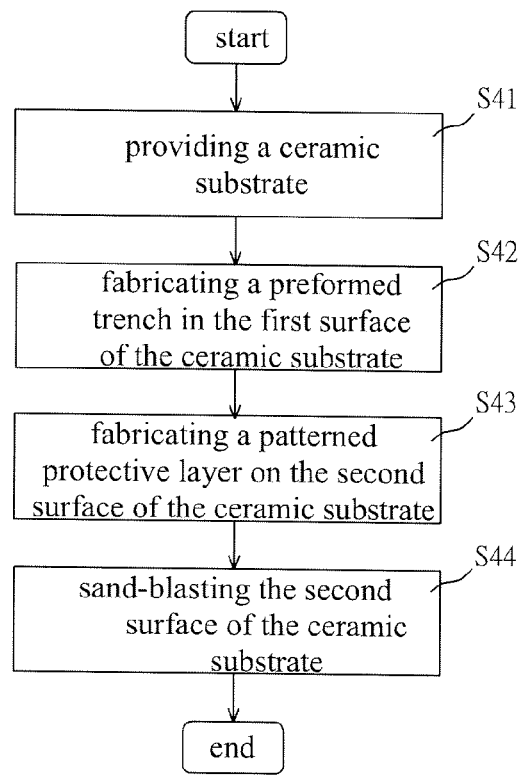
FIG. 5 is a flowchart of a method for manufacturing a ceramic substrate according to one embodiment of the present invention.

Refer to FIG. 1a, FIG. 1b and FIG. 4. In one embodiment, the package substrate 10 of the present invention is used to package a semiconductor chip 20, whereby to form a semiconductor chip package component 1. The package substrate 10 comprises a base substrate 12 and a ceramic substrate 14. The base substrate 12 is made of a ceramic material, a polymeric material or a metallic material. For example, the base substrate 12 is fabricated with at least one of a low-temperature co-fired ceramic (LTCC) substrate, a high-temperature co-fired ceramic (HTCC) substrate, a direct bonded copper (DBC) substrate, and a direct plate copper (DPC) substrate. A surface 120 of the base substrate 12 has two electric-conduction contacts 122a and 122b, which are respectively connected with two electrodes of the semiconductor chip 20. In one embodiment, the ceramic substrate 14 is fabricated with at least one of a low-temperature co-fired ceramic (LTCC) substrate and a high-temperature co-fired ceramic (HTCC) substrate. Distinct from the conventional technology that uses a plastic frame or a metallic substrate, the present invention adopts a ceramic substrate, which has a thermal expansion coefficient near that of semiconductor materials and features high thermal conductivity, high insulativity and high reliability.

The ceramic substrate 14 has a first surface 140, a second surface 142 opposite the first surface 140, and at least one cavity 144. The ceramic substrate 14 is disposed on the surface 120 of the base substrate 12 with the first surface 140 thereof facing the surface 120 of the base substrate 12. The cavity 144 penetrates the first surface 140 to form a first diameter 141 and penetrates the second surface 142 to form a second diameter 143, defining a chip receiving area on the surface 120 of the base substrate 12 and accommodating the electric-conduction contacts 122a and 122b. The cavity 144 has a vertical portion 145a and a gradually-varying portion 145b. The vertical portion 145a is near the first surface 140; the inner diameter of the vertical portion 145a is equal to the first diameter 141 of the cavity 144 on the first surface 140.

The gradually-varying portion 145b is near the second surface 142; the inner diameter of the gradually-varying portion 145b gradually increases from the first diameter 141 to the second diameter 143 of the cavity 144 on the second surface 142. In one embodiment, the inner surface of the gradually-varying portion 145b of the cavity 144 is treated with a coarsening process, such as a sand blasting process, to have a coarse surface. In one embodiment, the inner surface of the gradually-varying portion 145b of the cavity 144 is fabricated into a planar surface or a curved surface to meet the requirement of optical design. The person having ordinary skill in the art should be able to modify or vary the feature of the inner surface to meet requirement.

Figure 2:
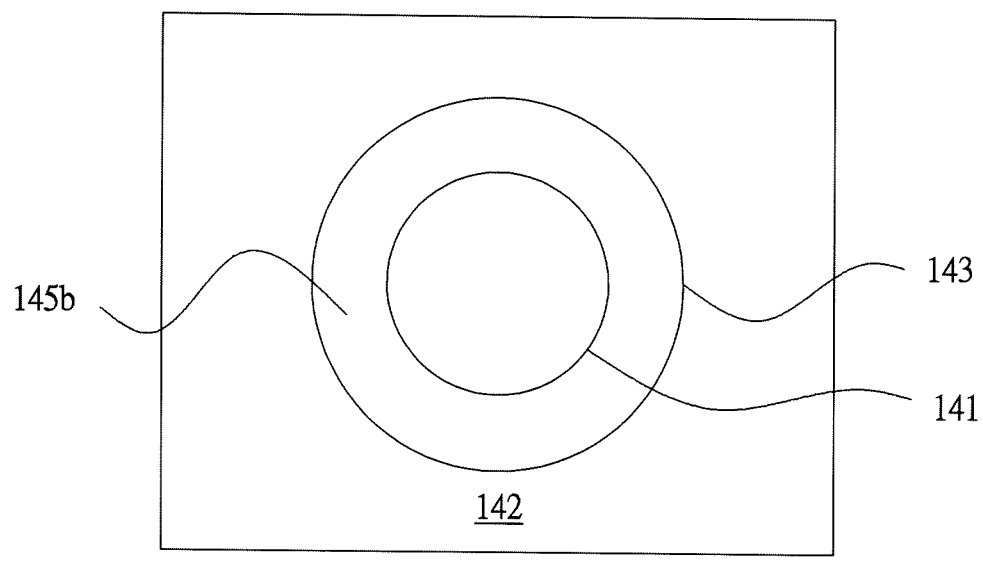
FIG. 2 is a top view schematically showing a ceramic substrate according to one embodiment of the present invention.
Figure 3:
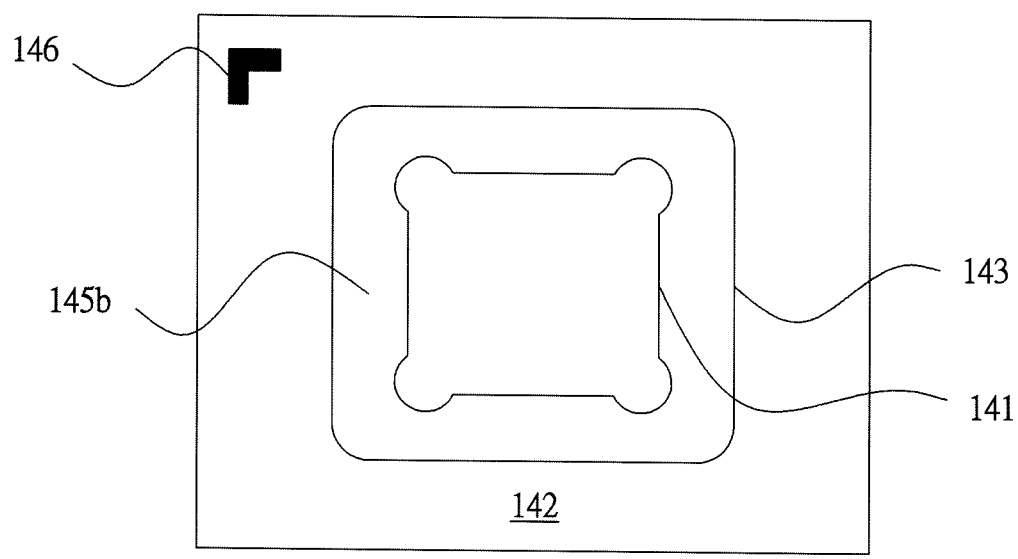
FIG. 3 is a top view schematically showing a ceramic substrate according to another embodiment of the present invention.

In one embodiment, each of the cross sections respectively corresponding to the first diameter 141 and the second diameter 143 has a circular shape (as shown in FIG. 2), an elliptic shape, a rectangular shape, a polygonal shape or a combination thereof, depending on the size of the semiconductor chip 20, the package process and the mechanism design of the package component. Refer to FIG. 3. In the embodiment shown in FIG. 3, the cross section corresponding to the first diameter 141 is fabricated into a rectangular shape with four corners thereof recessed outward, whereby the semiconductor chip 20 can be disposed on the chip receiving area more easily in the succeeding die-bonding process. In one embodiment, a positioning mark 146 is printed on the second surface 142 to facilitate the positioning process and the alignment process in the package process.

Refer to FIG. 4. One embodiment of the present invention proposes a semiconductor chip package component 1, wherein a semiconductor chip 20 is installed in the chip receiving area and electrically connected with two electric-conduction contacts 122a and 122b of the surface 120 of the base substrate 12 via a conventional bonding technology, such as an eutectic bonding technology or a flip chip bonding technology. The chip receiving area has been described above and will not repeat herein. The semiconductor chip 20 is a light emitting diode, a light-condensing solar chip, a transistor, an integrated circuit chip, an active element, a protective element or a passive element. Then, the semiconductor chip 20 and the electric-conduction contacts 122a and 122b are encapsulated with an encapsulant 30 to form the semiconductor chip package component 1. The encapsulant 30 is made of at least one material selected from a group including epoxy, silicone and hybrid package materials. In one embodiment, the semiconductor chip 20 is a light emitting diode. In such a case, a wavelength conversion material, such as a phosphor, may be added to the encapsulant 30 to generate a required working wavelength, such as white light. It should be easily understood: the gradually-varying portion 145b of the ceramic substrate 14 can increase the light extraction efficiency. Besides, the coarsened inner surface of the gradually-varying portion 145b can mix and uniformize light.

Figure 6A:
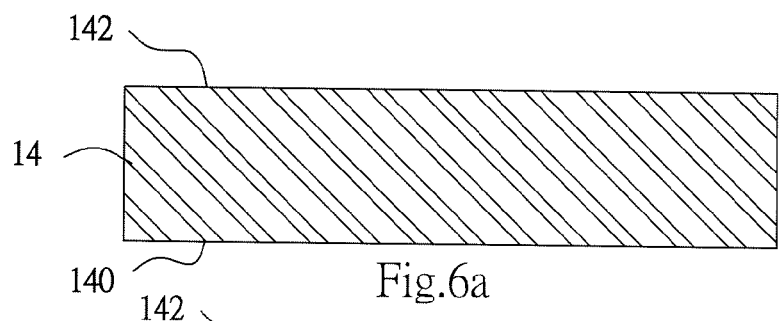
FIGS. 6a-6e are diagrams schematically showing the steps of a method for manufacturing a ceramic substrate according to one embodiment of the present invention.
Figure 6B:
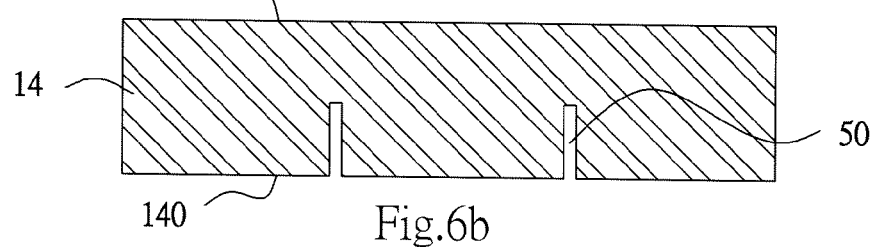
Figure 6C:
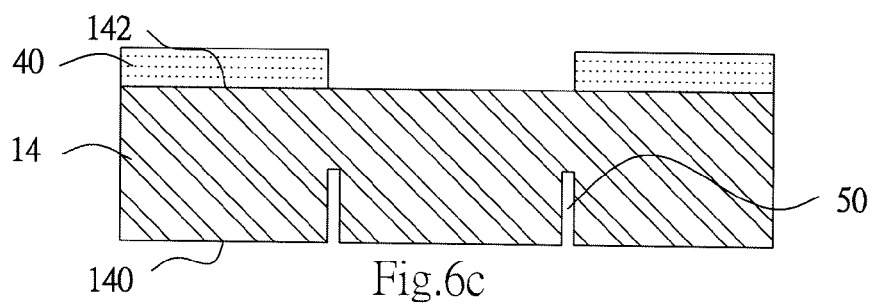
Figure 6D:
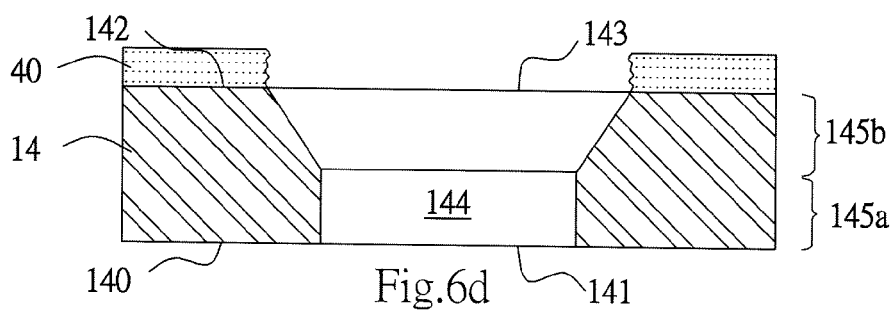

Refer to FIG. 5 and FIGS. 6a-6e. One embodiment of the present invention proposes a method for manufacturing a ceramic substrate having a cavity. In Step S41, provide a ceramic 14 having a first surface 140 and a second surface 142 opposite the first surface 140, as shown in FIG. 6a. Next, in Step S42, fabricate a preformed trench 50 in the first surface 140 of the ceramic substrate 14, as shown in FIG. 6b. In one embodiment, a laser beam is used to cut the trench 50. Next, in Step S43, fabricate a patterned protective layer 40 on the second surface 142 of the ceramic substrate 14, as shown in FIG. 6c. In one embodiment, the patterned protective layer 40 is fabricated with a photolithography technology, a mask-pressing technology or another conventional technology, which is well known and can be practiced by person having ordinary skill in the art. Next, in Step S44, sand-blast the second surface 142 to form a cavity 144 interconnecting with the trench 50, as shown in FIG. 6d. The cavity 144 penetrates the first surface 140 and the second surface 142 and has a vertical portion 145a and a gradually-varying portion 145b. The vertical portion 145a is near the first surface 145a. The inner diameter of the vertical potion 145a is identical to the first diameter 141 of the cavity 144 on the first surface 140. The gradually-varying portion 145b is near the second surface 142. The inner diameter of the gradually-varying portion 145b gradually increases from the first diameter 141 to the second diameter 143 of the cavity 144 on the second surface 142.

In one embodiment, the beads used in the sand blasting process are made of silicon carbide (SiC) and have an average diameter of 80 µm. In one embodiment, the sand blasting process includes a first sand blasting step and a second sand blasting step, which respectively use different impact forces. For example, the first sand blasting step uses an impact force of about 2-5 Kg/cm$^2$, and the second sand blasting step uses an impact force of about 1 Kg/cm$^2$ for finishing the cavity. It is easily understood: the gradually-varying portion 145b is realized by the sand blasting process, which coarsens the inner surface of the gradually-varying portion 145b.

Figure 6E:
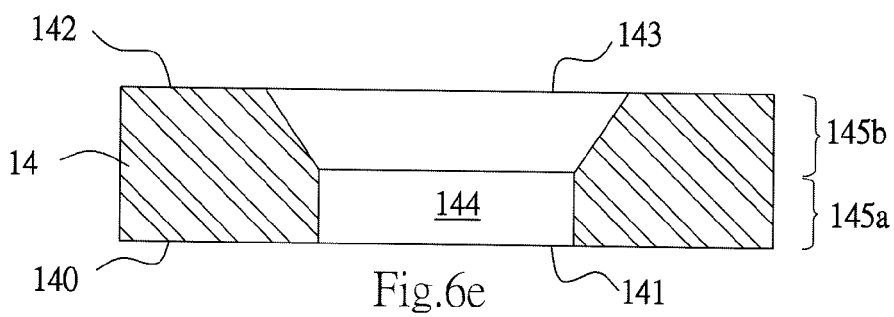

In one embodiment, the ceramic substrate 14 is cleaned. For example, the ceramic substrate 14 is cleaned with a brushing process or a flushing process to remove the dirt and debris generated by the fabrication steps, such as the laser cutting step. In one embodiment, a positioning mark 146 is fabricated on the second surface 142 with a laser cutting technology, a pigment-applying technology, a screen-printing technology, or another conventional technology, which is well known and can be practiced by the person having ordinary skill in the art. In one embodiment, before the patterned protective layer 40 is removed, the size and shape of the cavity is examined to verify whether the size and shape of the cavity meets the requirement. If there are defective products, such as the products having cavities whose diameters are too small, the defective products are returned to the blasting step and reprocessed once again. Compared with the conventional technology that use molds and a single sintering process to fabricate ceramic substrates, the present invention need not abandon defective products but reworks the defective products, wherefore the present invention can promote the yield and reduce the fabrication cost. In one embodiment, the patterned protective layer 40 is peeled off directly, etched off, or washed off with a basic solution, as shown in FIG. 6e.

In conclusion, the present invention proposes a ceramic substrate, a package substrate, a semiconductor chip package component and a manufacturing method thereof, wherein a preformed trench, a patterned protective layer and a sand blasting process are used to fabricate a cavity having precise size and shape in a ceramic substrate, and wherein the ceramic substrate is disposed on a base substrate to form a package substrate, and wherein the package substrate is used in packaging a semiconductor chip to form a semiconductor chip package component, and wherein the present invention adopts a ceramic substrate, which has a thermal expansion coefficient near that of semiconductor materials and features high thermal conductivity, high insulativity and high reliability. Compared with the conventional technology that uses different molds or modifies/redesigns molds to fabricate green ceramic compacts for ceramic substrates of different specifications and completes ceramic substrates in a single sintering process, the present invention is exempted from modifying molds or redesigning/re-fabricating molds. Further, the present invention uses a common base substrate in fabricating different ceramics. Furthermore, the present invention need not abandon defective products but reworks the defective products. Therefore, the present invention can increase the precision of the shape and size of the cavities of ceramic substrates, promote the yield and reduce the fabrication cost.

What is claimed is:

1. A method for manufacturing a ceramic substrate having a cavity, comprising steps:
    providing a ceramic substrate having a first surface and a second surface;
    fabricating a preformed trench in said first surface of said ceramic substrate;
    fabricating a patterned protective layer on said second surface of said ceramic substrate; and
    sand-blasting said second surface of said ceramic substrate to form a cavity, wherein said cavity penetrates said first surface and said second surface of said ceramic substrate and has a vertical portion and a gradually-varying portion, wherein said vertical portion is near said first surface and has an inner diameter identical to a first diameter of said cavity on said first surface, and wherein said gradually-varying portion is near said second surface and has an inner diameter gradually increasing from said first diameter to a second diameter of said cavity on said second surface.

2. The method for manufacturing a ceramic substrate having a cavity according to claim 1, wherein said sand blasting process includes a first sand blasting step and a second sand blasting step, which respectively have different impact forces.

3. The method for manufacturing a ceramic substrate having a cavity according to claim 1, wherein a laser beam is used to cut said first surface of said ceramic substrate to form said preformed trench.

4. The method for manufacturing a ceramic substrate having a cavity according to claim 1, wherein a position of said preformed trench is corresponding to said first diameter of said cavity on said first surface.

5. The method for manufacturing a ceramic substrate having a cavity according to claim 1 further comprising a step of removing said patterned protective layer.

6. The method for manufacturing a ceramic substrate having a cavity according to claim 1, wherein a cross section of said cavity, which is intersected by said first surface or said second surface, has a rectangular shape, wherein at least one corner of said rectangular shape is convexed outward to form a recess.

* * * * *